United States Patent
Yun et al.

(10) Patent No.: US 10,109,330 B1
(45) Date of Patent: Oct. 23, 2018

(54) SEMICONDUCTOR DEVICE

(71) Applicant: SK hynix Inc., Gyeonggi-do (KR)

(72) Inventors: Dae-Ho Yun, Gyeonggi-do (KR); Ha-Jun Jeong, Gyeonggi-do (KR); Gi-Moon Hong, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/869,167

(22) Filed: Jan. 12, 2018

(30) Foreign Application Priority Data

Jul. 11, 2017  (KR) .......................... 10-2017-0087766

(51) Int. Cl.
| G11C 7/06 | (2006.01) |
| G11C 7/22 | (2006.01) |
| G11C 7/14 | (2006.01) |
| G11C 7/10 | (2006.01) |
| G11C 16/28 | (2006.01) |

(52) U.S. Cl.
CPC .............. G11C 7/222 (2013.01); G11C 7/062 (2013.01); G11C 7/1006 (2013.01); G11C 7/14 (2013.01); G11C 7/22 (2013.01); G11C 16/28 (2013.01)

(58) Field of Classification Search
CPC ......... G11C 7/1006; G11C 7/14; G11C 7/062; G11C 7/22; G11C 16/28
See application file for complete search history.

(56) References Cited

U.S. PATENT DOCUMENTS

| 6,992,506 | B2 * | 1/2006 | Park ................. H03K 19/00346 |
| | | | 326/52 |
| 7,982,519 | B2 | 7/2011 | Lin |
| 8,812,892 | B1 | 8/2014 | Hill et al. |
| 2010/0054059 | A1 * | 3/2010 | Yoon ..................... G11C 7/1072 |
| | | | 365/194 |
| 2018/0143922 | A1 * | 5/2018 | Hong .................. G06F 13/1689 |

* cited by examiner

*Primary Examiner* — Pho M Luu
(74) *Attorney, Agent, or Firm* — IP & T Group LLP (57) ABSTRACT

A semiconductor device includes: an inversion circuit suitable for inverting a first data clock in response to an inversion signal; a first phase detection unit suitable for comparing a phase of the first data clock transferred from the inversion circuit with a phase of a system clock and generating a first detection result; a second phase detection unit suitable for comparing a phase of a second data clock with the phase of the system clock and generating a second detection result; an inversion signal generation unit suitable for generating the inversion signal that is enabled when the first detection result and the second detection result are different from each other; a first transferring unit suitable for transferring the first detection result; and a second transferring unit suitable for transferring the second detection result.

14 Claims, 5 Drawing Sheets

SEMICONDUCTOR DEVICE

CROSS-REFERENCE TO RELATED APPLICATIONS

The present application claims priority to Korean Patent Application No. 10-2017-0087766, filed on Jul. 11, 2017, which is incorporated herein by reference in its entirety.

BACKGROUND

1. Field

Exemplary embodiments of the present invention relate to a semiconductor device.

2. Description of the Related Art

A memory device is one type of semiconductor device for storing data. When a data processing device, such as a Memory Control Unit (MCU), requests retrieving or storing data, the memory device outputs the data corresponding to the address inputted from the memory control unit or store the data received from the memory control unit in a position corresponding to the address.

To this end, memory devices that are recently developed to operate at a high operation rate are designed to input/output two data pieces at a rising edge and a falling edge of a system clock that is applied externally and also to input/output other two data pieces at a falling edge and the next rising edge. In short, state-of-the art memory devices are designed to input/output four data pieces for one cycle of the system clock. However, since the system clock may represent only two states, which is a logic high level and a logic low level, a data clock having twice as fast a frequency as the system clock is required in order to input/output four data pieces during one cycle. In short, a clock dedicated to the input/output of data is required. Therefore, a memory device that operates at a high operation rate may control a data clock to have twice as fast a frequency as a system clock by using the system clock as a reference clock when an address and/or a command is transferred/received, while using the data clock as a reference clock when data is transferred/received. In other words, four data pieces are inputted/outputted for one cycle of the system clock by repeating the data clock for two cycles during one cycle of the system clock and controlling the input/output of data to occur at a rising edge and a falling edge of the data clock.

Unlike a typical DDR synchronous memory device using one system clock as a reference clock to perform a read operation or a write operation, a memory device operating at a high operation rate may transfer/receive data by using two clocks having different frequencies to perform a read operation or a write operation. However, if the phase of the system clock and the phase of the data clock are not aligned with each other, the reference for transferring an operation command and an address would not likely be aligned with the reference for transferring data, which may signify that the memory device operating at a high operation rate does not operate properly.

Therefore, in order for a memory device operating at a high operation rate to perform an operation properly, an interface training between the memory device and its memory control unit has to be performed during the initial stage of the operation. Herein, the interface training includes optimizing the interface for transferring a command, an address, and data before a normal operation is performed between the memory device and the memory control unit. The interface training may be divided into an address training, a clock alignment training (WCK2CK training), a read training, and a write training. Among them, during the clock alignment training (WCK2CK training), a data clock and a system clock are aligned with each other.

SUMMARY

Embodiments of the present invention are directed to a technology for alleviating the burden of a memory control unit in the course of aligning a data clock with a system clock in a semiconductor device.

In accordance with an embodiment of the present invention, a semiconductor device includes: an inversion circuit suitable for inverting a first data clock in response to an inversion signal; a first phase detection unit suitable for comparing a phase of the first data clock transferred from the inversion circuit with a phase of a system clock and generating a first detection result; a second phase detection unit suitable for comparing a phase of a second data clock with the phase of the system clock and generating a second detection result; an inversion signal generation unit suitable for generating the inversion signal that is enabled when the first detection result and the second detection result are different from each other; a first transferring unit suitable for transferring the first detection result; and a second transferring unit suitable for transferring the second detection result.

The semiconductor device may further include: a system clock receiving unit suitable for receiving the system clock transferred from a memory controller; a first data clock receiving unit suitable for receiving the first data clock transferred from the memory controller; and a second data clock receiving unit suitable for receiving the second data clock transferred from the memory controller.

The first data clock transferred from the inversion circuit and the second data clock received by the second data clock receiving unit may be used for at least one of data transfer and data reception of the semiconductor device.

The first phase detection unit may be suitable for detecting a logic level of the first data clock transferred from the inversion circuit at a rising edge of the system clock and generating the first detection result, and the second phase detection unit may be suitable for detecting a logic level of the second data clock at a rising edge of the system clock and generating the second detection result.

During a training operation for controlling the phases of the system clock, the first data clock, and the second data clock, the inversion signal generation unit may be enabled after the first phase detection unit and the second phase detection unit are enabled, and the first transferring unit and the second transferring unit may be enabled after the inversion signal generation unit is enabled.

When a logic level of the inversion signal is decided after the inversion signal generation unit is enabled, the logic level of the inversion signal may be fixed.

In accordance with another embodiment of the present invention, a semiconductor device includes: a first inversion circuit suitable for inverting a first data clock in response to a first inversion signal; a second inversion circuit suitable for inverting a second data clock in response to a second inversion signal; a first phase detection unit suitable for comparing a phase of the first data clock transferred from the first inversion circuit with a phase of a system clock and generating a first detection result; a second phase detection unit suitable for comparing a phase of a second data clock transferred from the second inversion circuit with the phase of the system clock and generating a second detection result; an inversion signal generation unit suitable for generating the first inversion signal and the second inversion signal based on the first detection result and the second detection result; a first transferring unit suitable for transferring the first detection result; and a second transferring unit suitable for transferring the second detection result.

The semiconductor device may further include: a system clock receiving unit suitable for receiving the system clock transferred from a memory controller; a first data clock receiving unit suitable for receiving the first data clock transferred from the memory controller; and a second data clock receiving unit suitable for receiving the second data clock transferred from the memory controller.

The first data clock transferred from the first inversion circuit and the second data clock transferred from the second inversion circuit may be used for at least one of data transfer and data reception of the semiconductor device.

The inversion signal generation unit may be suitable for enabling either one of the first inversion signal and the second inversion signal, when the first detection result and the second detection result are different from each other.

The inversion signal generation unit may be suitable for enabling the first inversion signal when the first detection result is at a first logic level, and suitable for disabling the first inversion signal when the first detection result is at a second logic level, and the inversion signal generation unit may be suitable for enabling the second inversion signal when the second detection result is at a first logic level, and suitable for disabling the second inversion signal when the second detection result is at a second logic level.

The first phase detection unit may be suitable for detecting a logic level of the first data clock transferred from the first inversion circuit at a rising edge of the system clock and generating the first detection result, and the second phase detection unit may be suitable for detecting a logic level of the second data clock transferred from the second inversion circuit at a rising edge of the system clock and generating the second detection result.

During a training operation for controlling the phases of the system clock, the first data clock, and the second data clock, the inversion signal generation unit may be enabled after the first phase detection unit and the second phase detection unit are enabled, and the first transferring unit and the second transferring unit may be enabled after the inversion signal generation unit is enabled.

When logic levels of the first inversion signal and the second inversion signal are decided after the inversion signal generation unit is enabled, the logic levels of the first inversion signal and the second inversion signal may be fixed.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

The terminology used herein is for the purpose of describing particular embodiments only and is not intended to be limiting of the present invention.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

Hereinafter, the various embodiments of the present invention will be described in detail with reference to the attached drawings.

Figure 1:
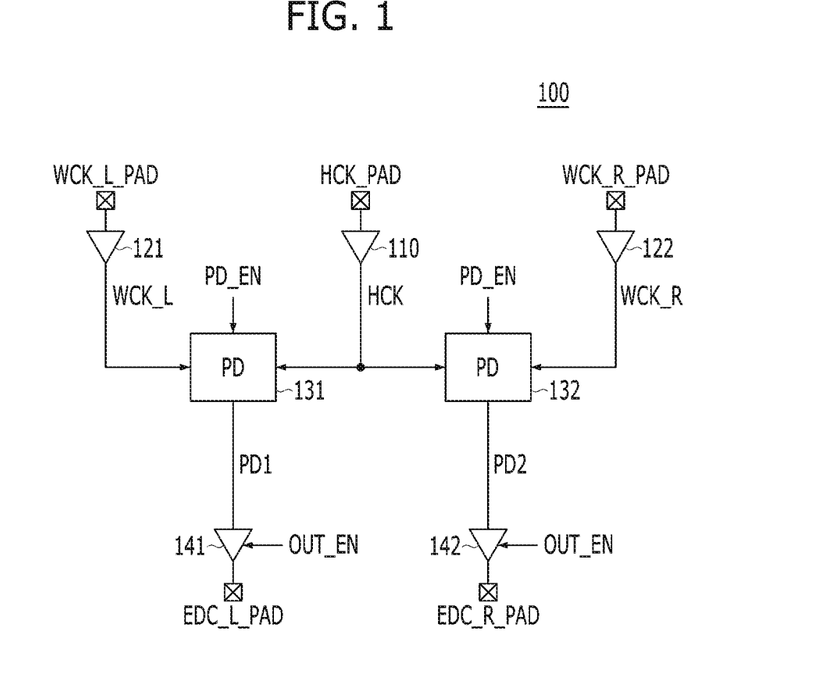
FIG. 1 is a schematic diagram illustrating a memory device in accordance with an embodiment of the present invention.

FIG. 1 is a schematic diagram illustrating a semiconductor device 100 in accordance with an embodiment of the present invention.

Referring to FIG. 1, the semiconductor device 100 may include a system clock receiving unit 110, a first data clock receiving unit 121, a second data clock receiving unit 122, a first phase detection unit 131, a second phase detection unit 132, a first transferring unit 141, and a second transferring unit 142. FIG. 1 shows a portion related to a clock alignment training (WCK2CK training) for aligning a system clock HCK with a data clock WCK_L and WCK_R in the memory device 100.

The system clock receiving unit 110 may receive the system clock HCK that is transferred from an external device such as, e.g., a memory controller through a system clock pad HCK_PAD. Herein, the system clock HCK may be used for the memory device 100 to receive a command and an address.

The first data clock receiving unit 121 may receive a first data clock WCK_L that is transferred from the memory controller through a first data clock pad WCK_L_PAD, and the second data clock receiving unit 122 may receive a second data clock WCK_R that is transferred from the memory controller through a second data clock pad WCK_R_PAD. The first data clock WCK_L and the second data clock WCK_R may be used for the memory device 100 to transfer/receive data. The first data clock WCK_L is used to transfer/receive data to/from data pads on the left side of the memory device 100, whereas the second data clock WCK_R is used to transfer/receive data to/from data pads on the right side of the memory device 100.

The first phase detection (PD) unit 131 may compare a phase of the system clock HCK with a phase of the first data clock WCK_L and generate a first detection result PD1 as a result of the comparison. The second phase detection unit 132 may compare the phase of the system clock HCK with a phase of the second data clock WCK_R and generate a second detection result PD2 as a result of the comparison. The first phase detection unit 131 may detect a logic level of the first data clock WCK_L at a rising edge of the system clock HCK and generate the first detection result PD1. Also, the second phase detection unit 132 may detect a logic level of the second data clock WCK_R at a rising edge of the system clock HCK and generate the second detection result PD2. A phase detection enable signal PD_EN may be a signal for enabling the first phase detection unit 131 and the second phase detection unit 132.

The first transferring unit 141 may transfer the first detection result PD1 to the memory controller through a first Error Detecting Code (EDC) pad EDC_R_PAD. Also, the second transferring unit 142 may transfer the second detection result PD2 to the memory controller through a second EDC pad EDC_R_PAD. A transfer enable signal OUT_EN may be a signal for enabling the first transferring unit 141 and the second transferring unit 142.

The memory controller or any suitable external device may transfer the system clock HCK, the first data clock WCK_L, and the second data clock WCK_R to the memory device 100. Also, the memory controller may control a delay value of the first data clock WCK_L based on the first detection result PD1, which is received from the memory device 100, and control a delay value of the second data clock WCK_R based on the second detection result PD2, which is received from the memory device 100. When the first detection result PD1 is at a logic high level, it may signify that a rising edge of the first data clock WCK_L is ahead of a rising edge of the system clock HCK. Therefore, the memory controller may increase the delay value of the first data clock WCK_L. In this case, the memory controller may continue to increase the delay value of the first data clock WCK_L until the logic level of the first detection result PD1 is changed into a logic low level. Conversely, when the first detection result PD1 is at a logic low level, it may signify that a rising edge of the first data clock WCK_L is behind a rising edge of the system clock HCK. Therefore, the memory controller may decrease the delay value of the first data clock WCK_L. In this case, the memory controller may continue to decrease the delay value of the first data clock WCK_L until the logic level of the first detection result PD1 is changed into a logic high level. Likewise, the memory controller may increase or decrease the delay value of the second data clock WCK_R based on the second detection result PD2. By the memory controller controlling the delay value of the first data clock WCK_L based on the first detection result PD1 and controlling the delay value of the second data clock WCK_R based on the second detection result PD2, the rising edges of the system clock HCK, the first data clock WCK_L, and the second data clock WCK_R may be aligned.

When the first detection result PD1 and the second detection result PD2 outputted from the memory device 100 are different, the memory controller may have to increase one delay value and decrease the other delay value for the first data clock WCK_L and the second data clock WCK_R. However, this operation may burden the memory controller unnecessarily. In general, the first data clock WCK_L and the second data clock WCK_R are clocks that are generated from the same source and the difference between the two lies in their path. Therefore, it may be more efficient to control the delay values of the first data clock WCK_L and the second data clock WCK_R in the same direction than to control the delay values of the first data clock WCK_L and the second data clock WCK_R in different directions.

Figure 2:
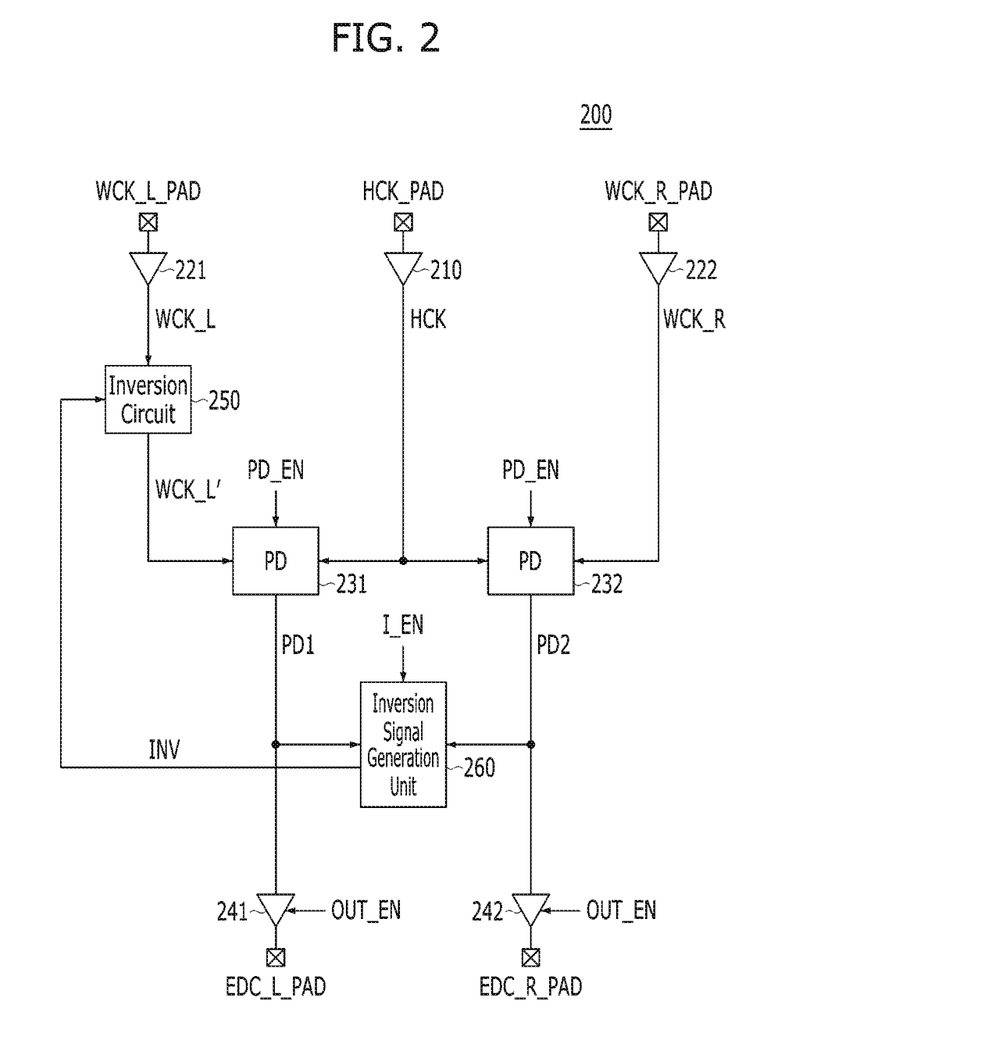
FIG. 2 is a schematic diagram illustrating a memory device in accordance with another embodiment of the present invention.

FIG. 2 is a schematic diagram illustrating a memory device 200 in accordance with another embodiment of the present invention.

Referring to FIG. 2, the memory device 200 may include a system clock receiving unit 210, a first data clock receiving unit 221, a second data clock receiving unit 222, a first phase detection unit 231, a second phase detection unit 232, a first transferring unit 241, a second transferring unit 242, an inversion circuit 250, and an inversion signal generation unit 260. FIG. 2 shows a portion related to a clock alignment training (WCK2CK training) for aligning a system clock HCK with a data clock WCK_L and WCK_R in the memory device 200.

The system clock receiving unit 210 may receive the system clock HCK that is transferred from an external device such as, e.g., a memory controller through a system clock pad HCK_PAD. Herein, the system clock HCK may be used for the memory device 200 to receive a command and an address.

The first data clock receiving unit 221 may receive a first data clock WCK_L that is transferred from the memory controller through a first data clock pad WCK_R_PAD, and the second data clock receiving unit 222 may receive a second data clock WCK_R that is transferred from the memory controller through a second data clock pad WCK_R_PAD.

The inversion circuit 250 may invert the first data clock WCK_L in response to an inversion signal INV. When the inversion signal INV is enabled, the inversion circuit 250 may invert the first data clock WCK_L and output an inverted first data clock WCK_L'. When the inversion signal INV is disabled, the inversion circuit 250 may output the first data clock WCK_L as it is. In other words, the output clock WCK_L' of the inversion circuit 250 produced when the inversion signal INV is enabled may be an inverted clock of the first data clock WCK_L, and the output clock WCK_L' of the inversion circuit 250 produced when the inversion signal INV is disabled may be the first data clock WCK_L as unchanged.

The output clock WCK_L' of the inversion circuit 250 and the second data clock WCK_R may be used for data transfer/reception of the memory device 200.

The first phase detection (PD) unit 231 may compare a phase of the system clock HCK with a phase of the output clock WCK_L' of the inversion circuit 250 and generate a first detection result PD1 as a result of the comparison. The second phase detection unit 232 may compare the phase of the system clock HCK with a phase of the second data clock WCK_R and generate a second detection result PD2 as a result of the comparison. The first phase detection unit 231 may detect a logic level of the output clock WCK_L' of the inversion circuit 250 at a rising edge of the system clock HCK and generate the first detection result PD1. Also, the second phase detection unit 232 may detect a logic level of the second data clock WCK_R at a rising edge of the system clock HCK and generate the second detection result PD2. A phase detection enable signal PD_EN may be a signal for enabling the first phase detection unit 231 and the second phase detection unit 232.

The inversion signal generation unit 260 may generate the inversion signal INV based on the first detection result PD1 and the second detection result PD2. If the first detection result PD1 and the second detection result PD2 are different from each other, the inversion signal INV may be enabled to a logic high level. If the first detection result PD1 and the second detection result PD2 are the same as each other, the inversion signal INV may be disabled to a logic low level. An inversion signal generation enable signal I_EN may be an enable signal of the inversion signal generation unit 260. When the inversion signal generation enable signal I_EN is disabled, the inversion signal INV may be maintained in the disabled state. When the logic level of the inversion signal INV is determined based on the first detection result PD1 and the second detection result PD2 after the inversion signal generation enable signal I_EN is enabled, the logic level of the inversion signal INV may be fixed or held constant until it has to be changed.

The first transferring unit 241 may transfer the first detection result PD1 to the memory controller through a first Error Detecting Code (EDC) pad EDC_L_PAD. Also, the second transferring unit 242 may transfer the second detection result PD2 to the memory controller through a second EDC pad EDC_R_PAD. A transfer enable signal OUT_EN may be a signal for enabling the first transferring unit 241 and the second transferring unit 242.

The memory device 200 of FIG. 2 may additionally include such circuits as dividers on the path where the first data clock WCK_L, the output clock WCK_L' of the inversion circuit 250, and the second data clock WCK_R are transferred.

Figure 3:
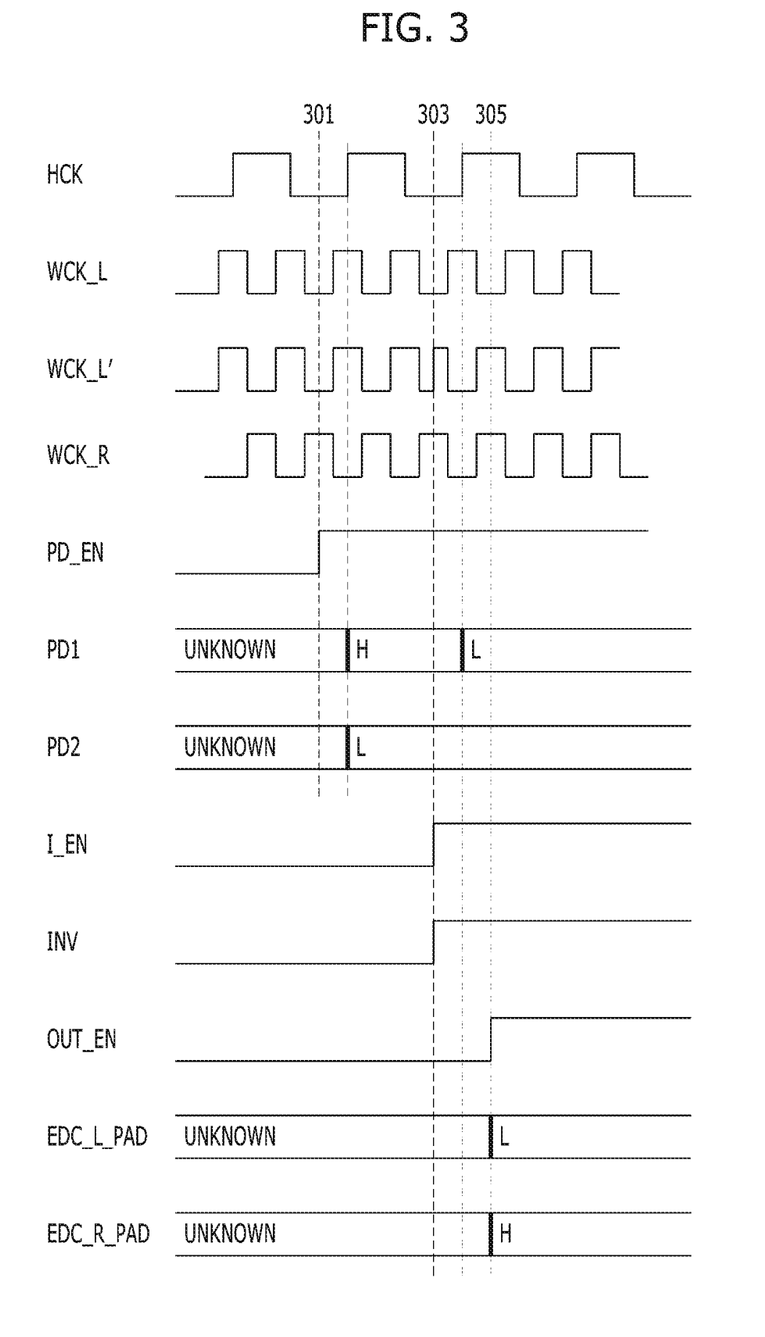
FIG. 3 is a waveform diagram illustrating a clock alignment training operation of the memory device shown in FIG. 2 in accordance with one embodiment.

FIG. 3 is a waveform diagram illustrating a clock alignment training operation of the memory device 200 shown in FIG. 2 in accordance with one embodiment.

Referring to FIG. 3, the phase detection enable signal PD_EN may be enabled at a moment 301, and thereby the first phase detection unit 231 and the second phase detection unit 232 may be enabled. Since the output clock WCK_L' of the inversion circuit 250 is in a logic high level at a rising edge of the system clock HCK, the first phase detection unit 231 may generate a first detection signal PD1 of a logic high level. Since the second data clock WCK_R is in a logic low level at a rising edge of the system clock HCK, the second phase detection unit 232 may generate a second detection signal PD2 of a logic low level.

The inversion signal generation enable signal I_EN may be enabled at a moment 303 so as to enable the inversion signal generation unit 260. Since the first detection signal PD1 and the second detection signal PD2 have different values, the inversion signal generation unit 260 may enable the inversion signal INV at a logic high level. From the moment 303, the inversion signal INV may be fixed to a logic high level, and the inversion circuit 250 may invert the first data clock WCK_L and generate the output clock WCK_L' of the inversion circuit 250. Since the phase of the output clock WCK_L' of the inversion circuit 250 is changed to the opposite phase from the moment 303, the logic level of the first detection signal PD1 may be changed from the logic high level into a logic low level.

The transfer enable signal OUT_EN may be enabled at a moment 305, and the first transferring unit 241 and the second transferring unit 242 may transfer the first detection signal PD1 and the second detection signal PD2 to the memory controller through the first EDC pad EDC_L_PAD and the second EDC pad EDC_R_PAD. The memory controller may decrease a delay value of the first data clock WCK_L until the logic level of the first detection signal PD1 transferred through the first EDC pad EDC_L_PAD is changed into a logic high level, and may also decrease a delay value of the second data clock WCK_R until the logic level of the second detection signal PD2 transferred through the second EDC pad EDC_R_PAD is changed into a logic high level.

Since the memory device 200 of FIG. 2 inverts and uses the first data clock WCK_L when the first detection signal PD1 and the second detection signal PD2 have different levels, the first detection signal PD1 and the second detection signal PD2 are outputted to the memory controller after they are controlled to have the same logic level. As a result, the memory controller may control the delay values of the first data clock WCK_L and the second data clock WCK_R in the same direction (i.e., either decreasing or increasing the delay values altogether). The output clock WCK_L' of the inversion circuit 250 and the second data clock WCK_R that are obtained after their timings are controlled by the memory controller may be used for data transfer/reception of the memory device 200.

Figure 4:
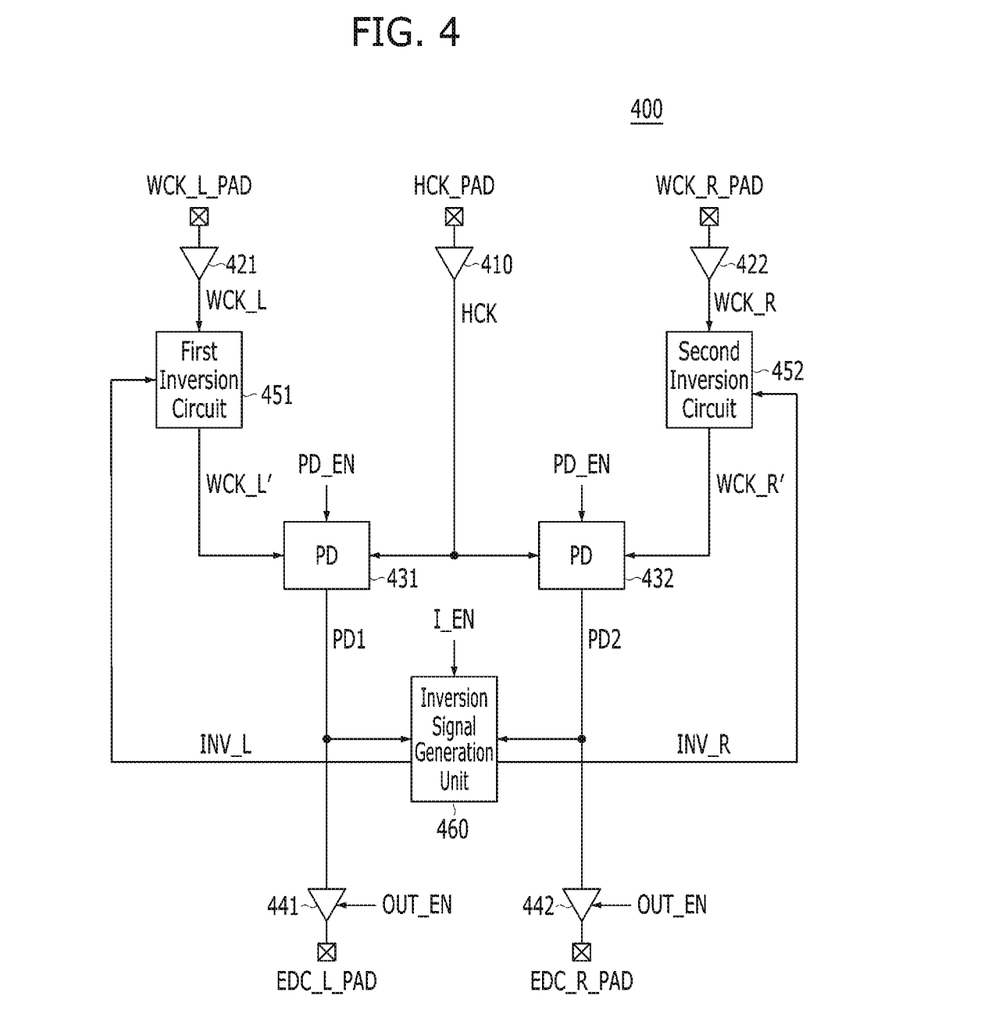
FIG. 4 is a schematic diagram illustrating a memory device in accordance with yet another embodiment of the present invention.

FIG. 4 is a schematic diagram illustrating a memory device 400 in accordance with yet another embodiment of the present invention.

Referring to FIG. 4, the memory device 400 may include a system clock receiving unit 410, a first data clock receiving unit 421, a second data clock receiving unit 422, a first phase detection unit 431, a second phase detection unit 432, a first transferring unit 441, a second transferring unit 442, a first inversion circuit 451, a second inversion circuit 452, and an inversion signal generation unit 460. FIG. 4 shows a portion related to a clock alignment training (WCK2CK training) for aligning a system clock HCK and a data clock WCK_L and WCK_R in the memory device 400.

The system clock receiving unit 410 may receive the system clock HCK that is transferred from a memory controller through a system clock pad HCK_PAD. Herein, the system clock HCK may be used for the memory device 400 to receive a command and an address.

The first data clock receiving unit 421 may receive a first data clock WCK_L that is transferred from the memory controller through a first data clock pad WCK_R_PAD, and the second data clock receiving unit 422 may receive a second data clock WCK_R that is transferred from the memory controller through a second data clock pad WCK_R_PAD.

The first inversion circuit 451 may invert the first data clock WCK_L in response to a first inversion signal INV_L. When the first inversion signal INV_L is enabled, the first inversion circuit 451 may invert the first data clock WCK_L and output an inverted first data clock WCK_L'. When the first inversion signal INV_L is disabled, the first inversion circuit 451 may output the first data clock WCK_L as it is. In other words, the output clock WCK_L' of the first inversion circuit 451 produced when the first inversion signal INV_L is enabled may be an inverted clock of the first data clock WCK_L, and the output clock WCK_L' of the first inversion circuit 451 produced when the first inversion signal INV_L is disabled may be the first data clock WCK_L as unchanged.

The second inversion circuit 452 may invert the second data clock WCK_R in response to a second inversion signal INV_R. When the second inversion signal INV_R is enabled, the second inversion circuit 452 may invert the second data clock WCK_R and output an inverted second data clock WCK_R'. When the second inversion signal INV_R is disabled, the second inversion circuit 452 may output the second data clock WCK_R as it is. In other words, the output clock WCK_R' of the second inversion circuit 452 produced when the second inversion signal INV_R is enabled may be an inverted clock of the second data clock WCK_R, and the output clock WCK_R' of the second inversion circuit 452 produced when the second inversion signal INV_R is disabled may be the second data clock WCK_R as unchanged.

The output clock WCK_L' of the first inversion circuit 451 and the output clock WCK_R' of the second inversion circuit 452 may be used for data transfer/reception of the memory device 400.

The first phase detection (PD) unit 431 may compare a phase of the system clock HCK with a phase of the output clock WCK_L' of the first inversion circuit 451 and generate a first detection result PD1 as a result of the comparison. The second phase detection unit 432 may compare the phase of the system clock HCK with a phase of the output clock WCK_R' of the second inversion circuit 452 and generate a second detection result PD2 as a result of the comparison. The first phase detection unit 431 may detect a logic level of the output clock WCK_L' of the first inversion circuit 451 at a rising edge of the system clock HCK and generate the first detection result PD1. Also, the second phase detection unit 432 may detect a logic level of the output clock WCK_R' of the second inversion circuit 452 at a rising edge of the system clock HCK and generate the second detection result PD2. A phase detection enable signal PD_EN may be a signal for enabling the first phase detection unit 431 and the second phase detection unit 432.

The inversion signal generation unit 460 may generate the first inversion signal INV_L and the second inversion signal INV_R based on the first detection result PD1 and the second detection result PD2, respectively. The inversion signal generation unit 460 may be designed to generate the first inversion signal and the second inversion signal INV_R through one method among the following methods (1), (2), and (3) described below.

(1) When the first detection result PD1 and the second detection result PD2 are the same, the inversion signal generation unit 460 may disable both the first inversion signal INV_L and the second inversion signal INV_R. When the first detection result PD1 and the second detection result PD2 are different, the inversion signal generation unit 460 may enable either one of the first inversion signal INV_L and the second inversion signal INV_R. In this case, the memory device 400 may perform a clock alignment training operation in the same method that the memory device 200 performs.

(2) When the first detection result PD1 is in a logic high level, the inversion signal generation unit 460 may enable the first inversion signal INV_L, and when the first detection result PD1 is in a logic low level, the inversion signal generation unit 460 may disable the first inversion signal INV_L. Likewise, when the second detection result PD2 is in a logic high level, the inversion signal generation unit 460 may enable the second inversion signal INV_R, and when the second detection result PD2 is in a logic low level, the inversion signal generation unit 460 may disable the second inversion signal INV_R. By the operation of the inversion signal generation unit 460, the first detection result PD1 and the second detection result PD2 may be transferred in the logic low level to the memory controller during the clock alignment training operation, and the memory controller may be able to control the delay values of the first data clock WCK_L and the second data clock WCK_R in the direction that the delay values of the first data clock WCK_L and the second data clock WCK_R are decreased.

(3) When the first detection result PD1 is in a logic high level, the inversion signal generation unit 460 may disable the first inversion signal INV_L, and when the first detection result PD1 is in a logic low level, the inversion signal generation unit 460 may enable the first inversion signal INV_L. Likewise, when the second detection result PD2 is in a logic high level, the inversion signal generation unit 460 may disable the second inversion signal INV_R, and when the second detection result PD2 is in a logic low level, the inversion signal generation unit 460 may enable the second inversion signal INV_R. By the operation of the inversion signal generation unit 460, the first detection result PD1 and the second detection result PD2 may be transferred in the logic high level to the memory controller during the clock alignment training operation, and the memory controller may be able to control the delay values of the first data clock WCK_L and the second data clock WCK_R in the direction that the delay values of the first data clock WCK_L and the second data clock WCK_R are increased.

An inversion signal generation enable signal I_EN may be an enable signal of the inversion signal generation unit 460. When the inversion signal generation enable signal I_EN is disabled, the first inversion signal INV_L and the second inversion signal INV_R may be maintained in the disabled state. When the logic levels of the first inversion signal INV_L and the second inversion signal INV_R are decided based on the first detection result PD1 and the second detection result PD2 after the inversion signal generation enable signal I_EN is enabled, the logic levels of the first inversion signal INV_L and the second inversion signal INV_R may be fixed.

The first transferring unit 441 may transfer the first detection result PD1 to the memory controller through a first Error Detecting Code (EDC) pad EDC_L_PAD. Also, the second transferring unit 442 may transfer the second detection result PD2 to the memory controller through a second EDC pad EDC_R_PAD. A transfer enable signal OUT_EN may be a signal for enabling the first transferring unit 441 and the second transferring unit 442.

The memory device 400 of FIG. 4 may additionally include such circuits as dividers on the path where the first data clock WCK_L, the output clock WCK_L' of the first inversion circuit 451, the second data clock WCK_R, and the output clock WCK_R' of the second inversion circuit 452 are transferred.

Figure 5:
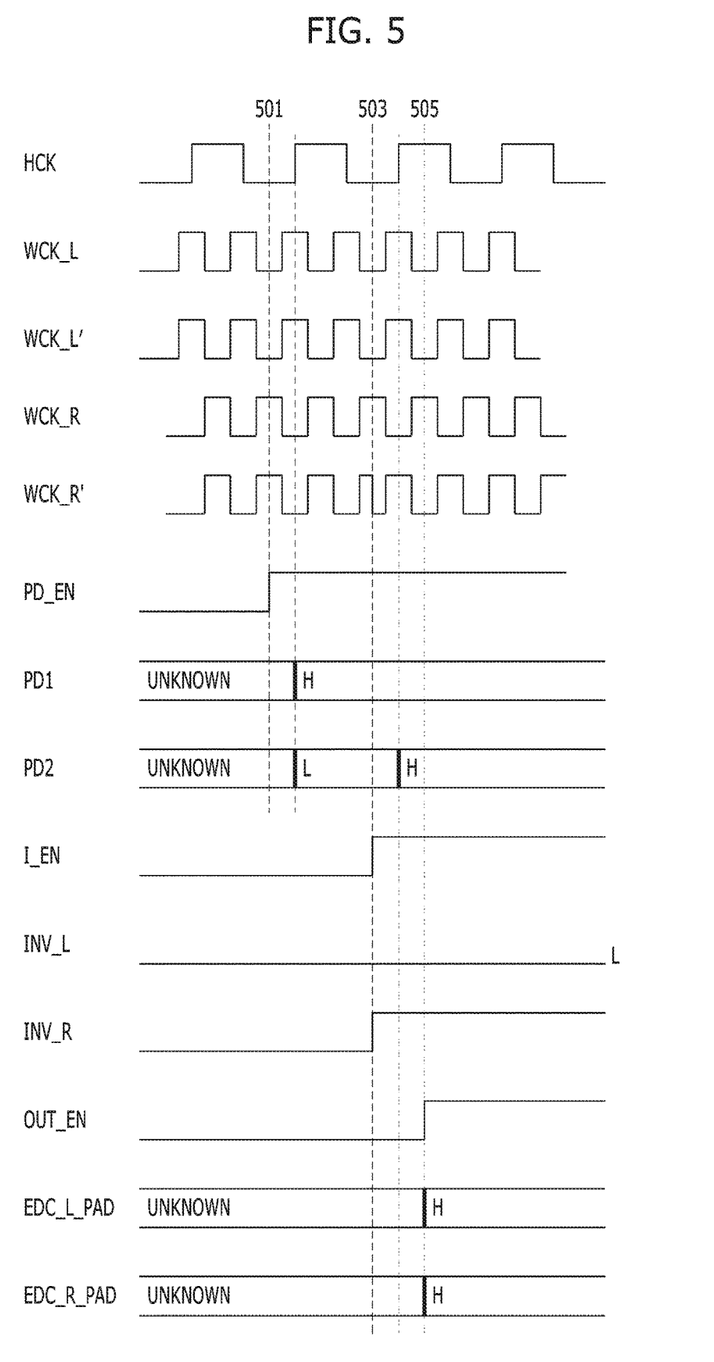
FIG. 5 is a waveform diagram illustrating a clock alignment training operation of the memory device shown in FIG. 4.

FIG. 5 is a waveform diagram illustrating a clock alignment training operation of the memory device 400 shown in FIG. 4. It is assumed in FIG. 5 that the inversion signal generation unit 460 generates the first inversion signal INV_L and the second inversion signal INV_R through the methods (1), (2) and/or (3).

Referring to FIG. 5, the phase detection enable signal PD_EN may be enabled at a moment 501, and thereby the first phase detection unit 431 and the second phase detection unit 432 may be enabled. Since the output clock WCK_L' of the first inversion circuit 451 is in a logic high level at a rising edge of the system clock HCK, the first phase detection unit 431 may generate a first detection signal PD1 of a logic high level. Since the output clock WCK_R' of the second inversion circuit 452 is in a logic low level at a rising edge of the system clock HCK, the second phase detection unit 432 may generate a second detection signal PD2 of a logic low level.

The inversion signal generation enable signal I_EN may be enabled at a moment 503 so as to enable the inversion signal generation unit 460. Since the first detection result PD1 is in a logic high level, the first inversion signal INV_L may be generated in a logic low level. Since the second detection result PD2 is in a logic low level, the second inversion signal INV_R may be generated in a logic high level. From the moment 503, the first inversion signal INV_L and the second inversion signal INV_R may be fixed to a logic high level, and the second inversion circuit 452 may invert the second data clock WCK_R and generate the output clock WCK_R' of the second inversion circuit 452. Since the phase of the output clock WCK_R' of the second inversion circuit 452 is changed to the opposite phase from the moment 503, the logic level of the second detection result PD2 may be changed from the logic low level into a logic high level.

The transfer enable signal OUT_EN may be enabled at a moment 505, and the first transferring unit 441 and the second transferring unit 442 may transfer the first detection signal PD1 and the second detection signal PD2 to the memory controller through the first EDC pad EDC_L_PAD and the second EDC pad EDC_R_PAD. The memory controller may increase a delay value of the first data clock WCK_L until the logic level of the first detection signal PD1 transferred through the first EDC pad EDC_L_PAD is changed into a logic low level, and may also increase a delay value of the second data clock WCK_R until the logic level of the second detection signal PD2 transferred through the second EDC pad EDC_R_PAD is changed into a logic low level.

Since the memory device 400 of FIG. 4 inverts and uses the first data clock WCK_L and the second data clock WCK_R so that logic levels of the first detection result PD1 and the second detection result PD2 become high, the memory controller may be able to control the delay values of the first data clock WCK_L and the second data clock WCK_R only in the direction that the delay values are increased.

According to various embodiments of the present invention, the burden of a memory control unit may be alleviated in the course of aligning a data clock with a system clock in a memory device.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
an inversion circuit suitable for inverting a first data clock in response to an inversion signal;
a first phase detection unit suitable for comparing a phase of the first data clock transferred from the inversion circuit with a phase of a system clock and generating a first detection result;
a second phase detection unit suitable for comparing a phase of a second data clock with the phase of the system clock and generating a second detection result;
an inversion signal generation unit suitable for generating the inversion signal that is enabled when the first detection result and the second detection result are different from each other;
a first transferring unit suitable for transferring the first detection result; and
a second transferring unit suitable for transferring the second detection result.

2. The semiconductor device of claim 1, further comprising:
a system clock receiving unit suitable for receiving the system clock transferred from a memory controller;
a first data clock receiving unit suitable for receiving the first data clock transferred from the memory controller; and
a second data clock receiving unit suitable for receiving the second data clock transferred from the memory controller.

3. The semiconductor device of claim 2, wherein the first data clock transferred from the inversion circuit and the second data clock received by the second data clock receiving unit are used for at least one of data transfer and data reception of the semiconductor device.

4. The semiconductor device of claim 1, wherein the first phase detection unit is suitable for detecting a logic level of the first data clock transferred from the inversion circuit at a rising edge of the system clock and generating the first detection result, and
the second phase detection unit is suitable for detecting a logic level of the second data clock at a rising edge of the system clock and generating the second detection result.

5. The semiconductor device of claim 1, wherein during a training operation for controlling the phases of the system clock, the first data clock, and the second data clock,
the inversion signal generation unit is enabled after the first phase detection unit and the second phase detection unit are enabled, and
the first transferring unit and the second transferring unit are enabled after the inversion signal generation unit is enabled.

6. The semiconductor device of claim 5, wherein when a logic level of the inversion signal is decided after the inversion signal generation unit is enabled, the logic level of the inversion signal is fixed.

7. A semiconductor device, comprising:
a first inversion circuit suitable for inverting a first data clock in response to a first inversion signal;
a second inversion circuit suitable for inverting a second data clock in response to a second inversion signal;
a first phase detection unit suitable for comparing a phase of the first data clock transferred from the first inversion circuit with a phase of a system clock and generating a first detection result;
a second phase detection unit suitable for comparing a phase of a second data clock transferred from the second inversion circuit with the phase of the system clock and generating a second detection result;
an inversion signal generation unit suitable for generating the first inversion signal and the second inversion signal based on the first detection result and the second detection result;
a first transferring unit suitable for transferring the first detection result; and
a second transferring unit suitable for transferring the second detection result.

8. The semiconductor device of claim 7, further comprising:
a system clock receiving unit suitable for receiving the system clock transferred from a memory controller;
a first data clock receiving unit suitable for receiving the first data clock transferred from the memory controller; and a second data clock receiving unit suitable for receiving the second data clock transferred from the memory controller.

9. The semiconductor device of claim 8, wherein the first data clock transferred from the first inversion circuit and the second data clock transferred from the second inversion circuit are used for at least one of data transfer and data reception of the semiconductor device.

10. The semiconductor device of claim 7, wherein the inversion signal generation unit is suitable for enabling either one of the first inversion signal and the second inversion signal, when the first detection result and the second detection result are different from each other.

11. The semiconductor device of claim 7, wherein the inversion signal generation unit is suitable for enabling the first inversion signal when the first detection result is at a first logic level, and is suitable for disabling the first inversion signal when the first detection result is at a second logic level, and the inversion signal generation unit is suitable for enabling the second inversion signal when the second detection result is at the first logic level, and suitable for disabling the second inversion signal when the second detection result is at the second logic level.

12. The semiconductor device of claim 7, wherein the first phase detection unit is suitable for detecting a logic level of the first data clock transferred from the first inversion circuit at a rising edge of the system clock and generating the first detection result, and the second phase detection unit is suitable for detecting a logic level of the second data clock transferred from the second inversion circuit at a rising edge of the system clock and generating the second detection result.

13. The semiconductor device of claim 7, wherein during a training operation for controlling the phases of the system clock, the first data clock, and the second data clock, the inversion signal generation unit is enabled after the first phase detection unit and the second phase detection unit are enabled, and the first transferring unit and the second transferring unit are enabled after the inversion signal generation unit is enabled.

14. The semiconductor device of claim 13, wherein when logic levels of the first inversion signal and the second inversion signal are decided after the inversion signal generation unit is enabled, the logic levels of the first inversion signal and the second inversion signal are fixed.

* * * * *